(12) United States Patent
Itoh et al.

(10) Patent No.: US 7,903,427 B2
(45) Date of Patent: Mar. 8, 2011

(54) SEMICONDUCTOR DEVICE STRUCTURE AND SEMICONDUCTOR DEVICE INCORPORATING SAME

(75) Inventors: Kohzoh Itoh, Hyogo-ken (JP); Kazuhiro Kawamoto, Ikeda (JP)

(73) Assignee: Ricoh Company, Ltd., Tokyo (JP)

( * ) Notice: Subject to any disclaimer, the term of this patent is extended or adjusted under 35 U.S.C. 154(b) by 458 days.

(21) Appl. No.: 12/039,532

(22) Filed: Feb. 28, 2008

(65) Prior Publication Data

US 2008/0203981 A1    Aug. 28, 2008

(30) Foreign Application Priority Data

Feb. 28, 2007  (JP) .................................. 2007-048453

(51) Int. Cl.
*H05K 1/16* (2006.01)
(52) U.S. Cl. .......... 361/766; 361/793; 174/256; 148/527
(58) Field of Classification Search .................. 361/766, 361/793; 174/256; 148/527
See application file for complete search history.

(56) References Cited

U.S. PATENT DOCUMENTS

| | | | |
|---|---|---|---|
| 4,878,770 A | | 11/1989 | Ruggierio et al. |
| 6,638,378 B2 * | | 10/2003 | O'Bryan et al. ............... 148/527 |
| 6,898,846 B2 * | | 5/2005 | Liu et al. ............................. 29/832 |
| 7,176,753 B2 | | 2/2007 | Noda et al. |
| 7,196,504 B2 | | 3/2007 | Itoh |
| 7,202,655 B2 | | 4/2007 | Itoh |
| 7,268,523 B2 | | 9/2007 | Itoh |
| 2001/0038906 A1 * | | 11/2001 | O'Bryan et al. ............... 428/209 |
| 2002/0180453 A1 | | 12/2002 | Itoh |
| 2004/0037061 A1 * | | 2/2004 | Liu et al. ........................... 361/793 |
| 2004/0233651 A1 * | | 11/2004 | Liu et al. ........................... 361/766 |
| 2005/0196251 A1 | | 9/2005 | Bakos |
| 2006/0180342 A1 * | | 8/2006 | Takaya et al. .................. 174/256 |
| 2006/0197649 A1 | | 9/2006 | Itoh |
| 2006/0250740 A1 | | 11/2006 | Itoh et al. |
| 2006/0291111 A1 | | 12/2006 | Itoh |
| 2007/0114982 A1 | | 5/2007 | Itoh et al. |
| 2007/0159147 A1 | | 7/2007 | Itoh |
| 2007/0210779 A1 | | 9/2007 | Itoh |

FOREIGN PATENT DOCUMENTS

| | | |
|---|---|---|
| JP | 01-223757 | 9/1989 |
| JP | 2005-196251 | 7/2005 |
| JP | 2005-276190 | 10/2005 |

* cited by examiner

*Primary Examiner* — Bao Q Vu
(74) *Attorney, Agent, or Firm* — Dickstein Shapiro LLP

(57) ABSTRACT

A semiconductor device structure includes a semiconductor substrate, a resistor layer, and a capacitor layer. The resistor layer is configured to overlie the semiconductor substrate. The resistor layer has a resistor disposed therewithin. The capacitor layer is configured to overlie the resistor layer. The capacitor layer has a capacitor disposed over and electrically connected with the resistor. Further, a semiconductor device that generates a constant output voltage from an input voltage includes a semiconductor substrate, a resistor layer, and a capacitor layer. The resistor layer is configured to overlie the semiconductor substrate. The resistor layer has a resistor disposed therewithin. The capacitor layer is configured to overlie the resistor layer. The capacitor layer has a capacitor disposed over and electrically connected with the resistor.

18 Claims, 3 Drawing Sheets

SEMICONDUCTOR DEVICE STRUCTURE AND SEMICONDUCTOR DEVICE INCORPORATING SAME

CROSS-REFERENCE TO RELATED APPLICATIONS

This application claims priority from Japanese Patent Application No. 2007-048453, filed on Feb. 28, 2007 in the Japanese Patent Office, the entire contents of which are incorporated by reference herein.

FIELD OF THE INVENTION

The present invention relates to a semiconductor device structure, and more particularly, to a semiconductor device structure having a resistor and a metal-insulator-metal capacitor connectable to each other and a semiconductor device using the structure, which reduces the size and increases the stability of the semiconductor device.

BACKGROUND OF THE INVENTION

Capacitors are used in constant voltage supplies such as switching regulators and series regulators. A semiconductor circuit having a constant power supply uses a phase compensation capacitor in conjunction with a resistor to enhance stability in voltage regulation. The use of such a resistor-capacitor (RC) circuit compensates for phase shifts in output voltage.

Various methods have been proposed to provide a semiconductor circuit with an efficient RC structure. For example, a related-art semiconductor device having a resistor connected with a metal-insulator-metal (MIM) capacitor provides an RC structure with a reduced size. According to this method, at least one of upper and lower metal electrodes of the MIM capacitor uses a resistive metal plate of a given sheet resistance. The resistive metal plate integrally forms the capacitor electrode and the resistor, establishing a series RC circuit therebetween.

Although effective in reducing overall size of the semiconductor device, the above method cannot be used to provide a parallel RC circuit. Accordingly, a demand exists for a semiconductor device structure with a resistor and a capacitor designed to allow both parallel and series connections therebetween while achieving size reduction and excellent stabilizing performance of the RC circuit.

SUMMARY OF THE INVENTION

This patent specification describes a novel semiconductor device structure having a resistor and a capacitor connectable to each other.

In one embodiment, the novel semiconductor device structure includes a semiconductor substrate, a resistor layer, and a capacitor layer. The resistor layer is configured to overlie the semiconductor substrate. The resistor layer has a resistor disposed therewithin. The capacitor layer is configured to overlie the resistor layer. The capacitor layer has a capacitor disposed over and electrically connected with the resistor.

This patent specification also describes a novel semiconductor device that generates a constant output voltage from an input voltage, having a resistor and a capacitor connectable to each other.

In one embodiment, the novel semiconductor device that generates a constant output voltage from an input voltage includes a semiconductor substrate, a resistor layer, and a capacitor layer. The resistor layer is configured to overlie the semiconductor substrate. The resistor layer has a resistor disposed therewithin. The capacitor layer is configured to overlie the resistor layer. The capacitor layer has a capacitor disposed over and electrically connected with the resistor.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1A:
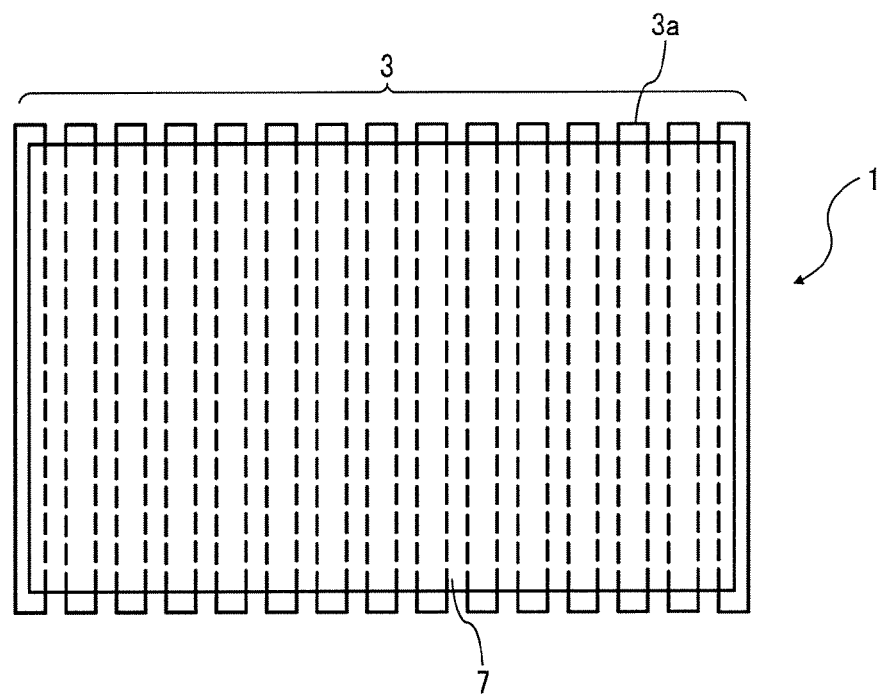
FIG. 1A is a top view of a semiconductor device structure according to at least one example embodiment of this patent specification.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, example embodiments of this patent specification are described.

Figure 1B:
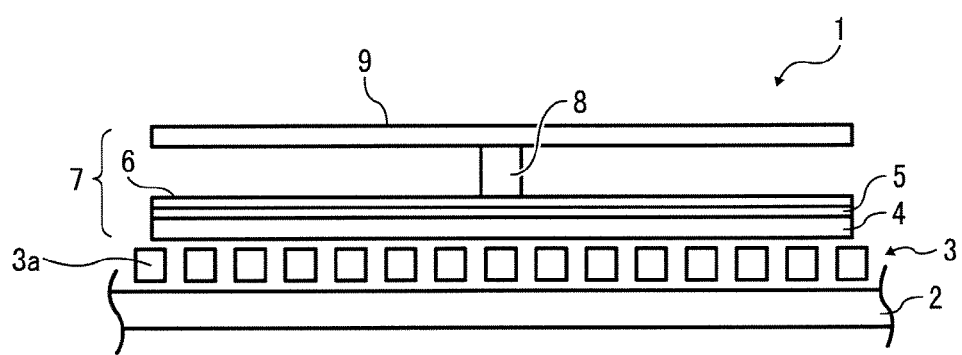
FIG. 1B is a cross-sectional view of the semiconductor device structure of FIG. 1A.

Referring to FIGS. 1A and 1B of the drawings, top and cross-sectional views of a semiconductor device structure 1 according to at least one example embodiment of this patent specification are described.

As shown in FIGS. 1A and 1B, the semiconductor device structure 1 includes a semiconductor substrate 2, a resistor layer 3, a metal wiring layer 4, a dielectric layer 5, a metal film 6, a through hole 8, and a metal wiring layer 9. The resistor layer 3 includes a plurality of resistor segments 3a. The metal wiring layer 4, the dielectric layer 5, the metal film 6, the through hole 8, and the metal wiring layer 9 form a metal-insulator-metal (MIM) capacitor 7. In the MIM capacitor 7, the metal wiring layer 4 acts as a first electrode, the metal film 6 combined with the through hole 8 and the metal wiring layer 9 acts as a second electrode, and the dielectric layer 5 acts as an insulator electrically separating the first and second electrodes.

In the semiconductor device structure 1, the resistor layer 3 is disposed immediately over the semiconductor substrate 2. The MIM capacitor 7 is disposed over the resistor layer 3. Although not depicted in the drawings, an insulator is provided to electrically isolate adjacent components and/or layers of the semiconductor device structure 1 unless otherwise noted, such as between the semiconductor substrate 2 and the resistor layer 3, and between the resistor layer 3 and the MIM capacitor 7, as well as between the metal film 6 and the metal wiring layer 9, respectively.

In the resistor layer 3, the plurality of resistor segments 3a, which are formed as uniform strips of resistive material, are interconnected at ends thereof by the metal wiring layer 4 so as to form one or more resistors of given resistance.

In the MIM capacitor 7, the dielectric layer 5 has a lower surface in close contact with the metal wiring layer 4 and an upper surface in close contact with the metal film 6. The metal wiring layer 9 is disposed above the metal film 6, and is connected thereto via the through hole 8 providing a metal interconnect. The electrodes of the MIM capacitor 7 are designed to have a surface area sufficient to provide a desired capacitance, and may be formed to cover either a substantially entire area or only portions of the resistor layer 3. Further, it is contemplated that the MIM capacitor 7 be configured as multiple separate MIM capacitors.

The semiconductor device structure 1 described in FIGS. 1A and 1B, wherein the MIM capacitor 7 overlies the resistor layer 3 and is electrically well isolated from the resistors formed beneath, may provide a reduction in size while allowing a resistor-capacitor (RC) connection to be formed either in parallel or in series. In addition, when implemented in an analog integrated circuit, the semiconductor device structure 1 does not cause significant parasitic capacitance between the MIM capacitor 7 and other circuit components, thus preventing detrimental effects on, and ensuring proper operation and accuracy of, the analog circuit. To effectively implement the semiconductor device structure 1, it is preferable to use the MIM capacitor 7 and the resistor layer 3 in conjunction with each other and/or both connected to a substantially same potential.

Figure 2:
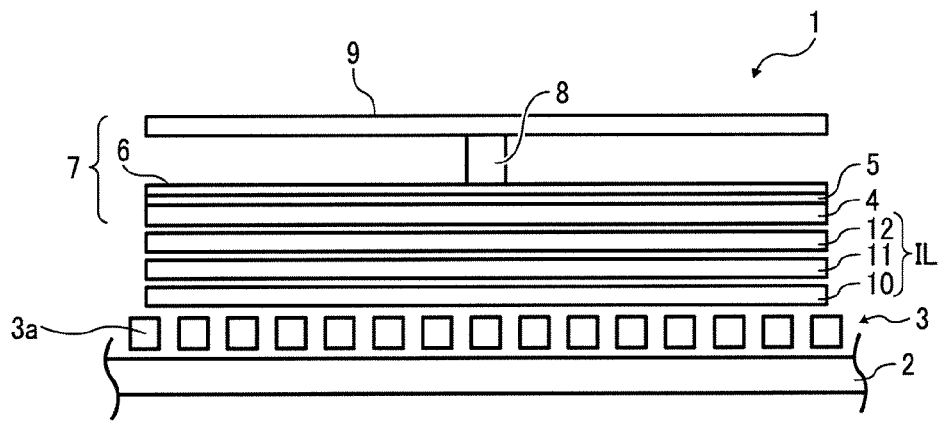
FIG. 2 is a cross-sectional view of the semiconductor device structure according to another embodiment of this patent specification.

Referring now to FIG. 2, a cross-sectional view illustrating the semiconductor device structure 1 according to another embodiment of this patent specification is described.

As shown in FIG. 2, the semiconductor device structure 1 of this embodiment includes an interlayer portion IL in addition to the semiconductor substrate 2, the resistor layer 3, as well as the dielectric layer 5, the metal film 6, the through hole 8, and the metal wiring layer 9 forming the MIM capacitor 7. Further, the interlayer portion IL includes one or more metal wiring layers 10 through 12.

In the embodiment of FIG. 2, the semiconductor device structure 1 is formed in a manner similar to that depicted in FIGS. 1A and 1B, except that the interlayer portion IL is inserted between the MIM capacitor 7 and the resistor layer 3 over the semiconductor substrate 2. Although not depicted in the drawings, an insulator is provided to electrically isolate adjacent components and/or layers of the semiconductor device structure 1 unless otherwise noted, such as between the semiconductor substrate 2 and the resistor layer 3, between the resistor layer 3 and the interlayer portion IL, and between the interlayer portion IL and the MIM capacitor 7, as well as between the metal film 6 and the metal wiring layer 9, and between the layers within the interlayer portion IL, respectively.

In the resistor layer 3, the plurality of resistor segments 3a, which are formed as uniform strips of resistive material, are interconnected at ends thereof by the metal wiring layer 10 so as to form one or more resistors of given resistance.

In the interlayer portion IL, the metal wiring layers 11 and 12 each forms a circuit interconnecting element. While the interlayer portion IL described herein includes the three layers 10 through 12, it may be possible to form the interlayer portion IL with only one layer that interconnects the plurality of resistor segments 3a.

In the MIM capacitor 7, the dielectric layer 5 has a lower surface in close contact with the metal wiring layer 4 and an upper surface in close contact with the metal film 6. The metal wiring layer 9 is disposed above the metal film 6, and is connected thereto via the through hole 8 providing a metal interconnect. The electrodes of the MIM capacitor 7 are designed to have a surface area sufficient to provide a desired capacitance, and may be formed to cover either a substantially entire area or only portions of the resistor layer 3. Further, it is contemplated that the MIM capacitor 7 be configured as multiple separate MIM capacitors.

The semiconductor device structure 1 described in FIG. 2, wherein the MIM capacitor 7 overlies the resistor layer 3 and is electrically well isolated from the resistors formed beneath, may provide a reduction in size while allowing an RC connection to be formed either in series or in parallel. In addition, when implemented in an analog integrated circuit, the semiconductor device structure 1 does not cause significant parasitic capacitance between the MIM capacitor 7 and other circuit components, thus preventing detrimental effects on, and ensuring proper operation and accuracy of, the analog circuit.

The semiconductor device structure 1 according to this patent specification may be incorporated in a semiconductor device that has a resistor and a capacitor connected in series or in parallel, e.g., any constant voltage circuit that includes a voltage divider to divide an output voltage, working in conjunction with an error amplifier to amplify a difference between the divided voltage and a reference voltage to provide a feedback signal.

Figure 3:
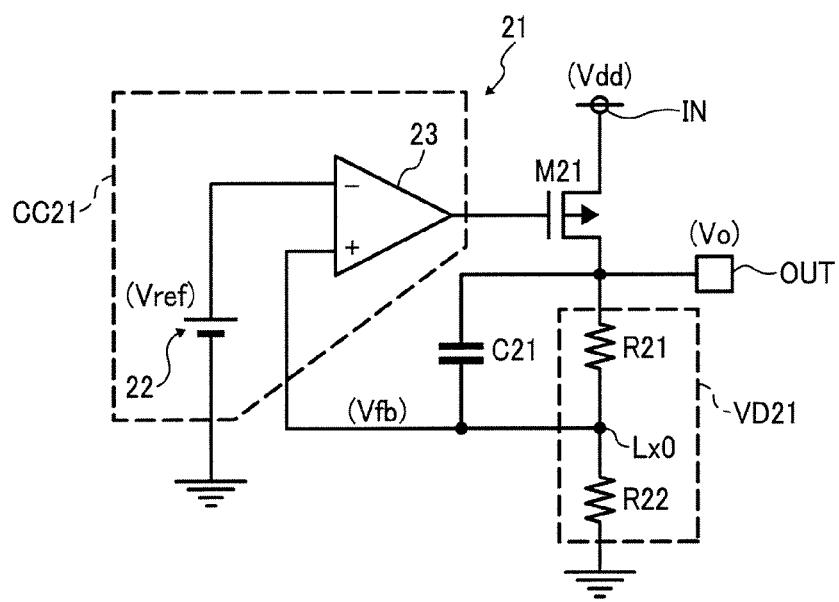
FIG. 3 is a circuit diagram illustrating an example of a series regulator incorporating the semiconductor device structure.

Referring now to FIG. 3, a circuit diagram illustrating an example of a series regulator 21 is described. The series regulator 21 is a semiconductor device incorporating the semiconductor device structure 1.

As shown in FIG. 3, the series regulator 21 includes an input terminal IN, an output terminal OUT, an output transistor M21, a control circuit CC21, a voltage divider VD21, and a capacitor C21. The control circuit CC21 includes a reference voltage generator 22 and an error amplifier 23. The voltage divider VD21 includes resistors R21 and R22. Such components of the series regulator 21 may be constructed on and integrated within a single integrated circuit (IC).

In the series regulator 21, the output transistor M21 is connected between the input and output terminals IN and OUT. The output transistor M21 is a P-channel metal-oxide semiconductor (PMOS), and has a gate connected to the control circuit CC21.

The voltage divider VD21 is connected to the output terminal OUT. In the voltage divider VD21, the resistors R21 and R22 are connected in series between the output terminal OUT and ground, forming a divider node Lx0 therebetween. The resistor R21 is connected in parallel with the capacitor C21.

The control circuit CC21 is connected to the divider node Lx0. In the control circuit CC21, the error amplifier 23 has a non-inverting input connected to the divider node Lx0 and an inverting input connected to the reference voltage generator 22. The error amplifier 23 also has an output connected to the gate of the output transistor M21.

In operation, the series regulator 21 receives an input voltage Vdd at the input terminal IN, and transmits a regulated output voltage Vo to the output terminal OUT.

The voltage divider VD21 monitors the output voltage Vo, in which the resistors R21 and R22 generate a feedback voltage Vfb at the divider node Lx0 based on the output voltage Vo. The capacitor C21 acts as a speedup capacitor, which briefly transmits changes in the output voltage Vo to the feedback voltage Vfb.

The control circuit CC21 outputs a control signal to control operation of the output transistor M21. The reference voltage generator 22 generates a given reference voltage Vref. The error amplifier 23 compares the feedback voltage Vfb with the given reference voltage Vref to generate the control signal by amplifying a difference between Vfb and Vref.

The output transistor M21 regulates current therethrough according to the control signal applied to the gate. This reduces the difference between Vfb and Vref, and as a result, the output voltage Vo is maintained at a given constant level lower than the input voltage Vdd.

In such a configuration, the series regulator 21 incorporates the semiconductor device structure 1 wherein the capacitor C21 corresponds to the overlying MIM capacitor 7, and the resistors R21 and R22 correspond to resistors formed beneath in the resistor layer 3. Preferably, the resistors R21 and R22 each may be formed by combining a specific number of resistor segments to obtain a precise desired resistance ratio. Further, the capacitor C21 may be disposed over the resistors R21 and R22 as in the embodiment illustrated in FIGS. 1A and 1B so as to prevent parasitic capacitance to be formed between the capacitor C21 and other components, thus ensuring accuracy and proper performance of the series regulator 21.

Figure 4:
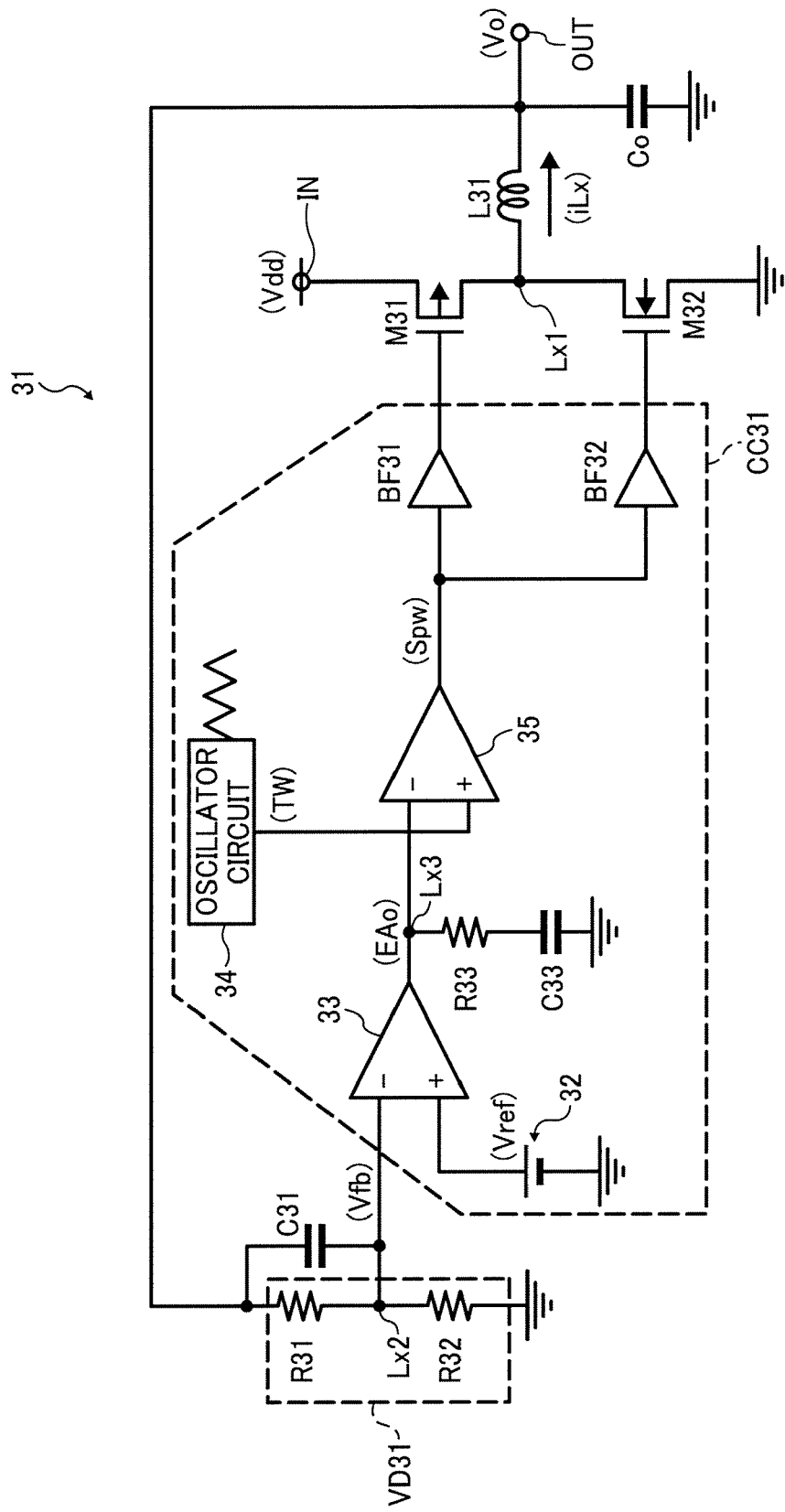
FIG. 4 is a circuit diagram illustrating an example of a step-down switching regulator incorporating the semiconductor device structure.

Referring now to FIG. 4, a circuit diagram illustrating an example of a step-down switching regulator 31 is described. The switching regulator 31 is a semiconductor device incorporating the semiconductor device structure 1.

As shown in FIG. 4, the switching regulator 31 includes an input terminal IN, an output terminal OUT, a switching transistor M31, a synchronous rectifier transistor M32, an inductor L31, and a smoothing capacitor Co. The switching regulator 31 also includes a voltage divider VD31, a capacitor C31, and a control circuit CC31. The voltage divider VD31 includes resistors R31 and R32. The control circuit CC31 includes a reference voltage generator 32, an error amplifier 33, a resistor R33, a capacitor C33, an oscillator circuit 34, a pulse width modulation (PWM) comparator 35, and buffers BF31 and BF32.

In the switching regulator 31, the transistors M31 and M32 are connected in series between the input terminal IN and ground, forming an output node Lx1 therebetween. The switching transistor M31 is a PMOS transistor and the synchronous rectifier transistor M32 is an N-channel metal-oxide semiconductor (NMOS) transistor, each having a gate connected to the control circuit CC31. The inductor L31 is connected between the output node Lx1 and the output terminal OUT. The smoothing capacitor Co is connected between the output terminal OUT and ground.

The voltage divider VD31 is connected to the output terminal OUT. In the voltage divider VD31, the resistors R31 and R32 are connected in series between the output terminal OUT and ground, forming a divider node Lx2 therebetween. The resistor R31 is connected in parallel with the capacitor C31.

The control circuit CC31 is connected to the divider node Lx2. In the control circuit CC31, the error amplifier 33 has an inverting input connected to the divider node Lx2, and a non-inverting input connected to the reference voltage generator 32. The error amplifier 33 also has an output connected to an error node Lx3.

The resistor R33 and the capacitor C33 are connected in series between the error node Lx3 and ground. The PWM comparator 35 has an inverting input connected to the error node Lx3, and a non-inverting input connected to the oscillator circuit 34. The PWM comparator 35 also has an output connected to the gate of the switching transistor M31 through the buffer BF31, and to the gate of the synchronous rectifier transistor M32 through the buffer BF32, respectively.

The circuit components of the switching regulator 31 except for the inductor L31 and the smoothing capacitor Co may be constructed on and integrated within a single IC. Alternatively, the components except for the inductor L31, the smoothing capacitor Co, and at least one of the transistors M31 and M32 may be constructed on and integrated within a single IC.

In operation, the switching regulator 31 receives an input voltage Vdd at the input terminal IN, and transmits a regulated output voltage Vo to the output terminal OUT.

The voltage divider VD31 monitors the output voltage Vo, in which the resistors R31 and R32 generate a feedback voltage Vfb at the divider node Lx2 based on the output voltage Vo. The capacitor C31 acts as a speedup capacitor, which briefly transmits changes in the output voltage Vo to the feedback voltage Vfb.

The control circuit CC31 serves to control operation of the transistors M31 and M32 using pulse width modulation. In the control circuit CC31, the reference voltage generator 32 generates a given reference voltage Vref. The error amplifier 33 compares the feedback voltage Vfb with the given reference voltage Vref to generate an error voltage EAo at the error node Lx3. The oscillator circuit 34 outputs a given triangle wave signal TW. The resistor R33 and the capacitor C33 form a compensation circuit which compensates for phase shifts in the error voltage EAo. The PWM comparator 35 compares the error voltage EAo with the triangle wave signal TW to output a pulse signal Spw, which has a duty cycle modulated according to changes in the output voltage Vo. The pulse signal Spw is applied to the gate of the regulator transistor M31 via the buffer BF31, and to the gate of the synchronous rectifier transistor M32 via the buffer 32, respectively.

The transistors M31 and M32 turn on and off in a complementary manner according to the pulse signal Spw, alternately charging and discharging the inductor L31 to regulate inductor current iLx flowing therethrough. As a result, the output voltage Vo is maintained at a given constant level lower than the input voltage Vdd.

For example, when the output voltage Vo increases, the duty cycle of the pulse signal Spw decreases as the error voltage EAo decreases. This results in a longer period of time during which the switching transistor M31 is off and the synchronous rectifier transistor M32 is on, which correspondingly reduces the output voltage Vo. When the output voltage Vo decreases, the duty cycle of the pulse signal Spw increases as the error voltage EAo increases. This results in a longer period of time during which the switching transistor M31 is on and the synchronous rectifier transistor M32 is off, which correspondingly increases the output voltage Vo.

In such a configuration, the switching regulator 31 incorporates the semiconductor device structure 1, wherein the capacitor C31 corresponds to the MIM capacitor 7, and the resistors R31 and R32 correspond to resistors formed in the resistor layer 3, and/or wherein the capacitor C33 corresponds to the MIM capacitor 7, and the resistor R33 corresponds to a resistor formed in the resistor layer 3. Preferably, the resistors R31 and R32 are formed by combining a specific number of resistor segments to obtain a precise desired resistance ratio. Further, the capacitor C31 may be disposed over the resistors R31 and R32 as in the embodiment illustrated in FIGS. 1A and 1B so as to prevent parasitic capacitance to be formed between the capacitor C31 and other components, thus ensuring accuracy and proper performance of the switching regulator 31. Furthermore, the capacitor C33 may be disposed over the resistor R33 as in the embodiment illustrated in FIGS. 1A and 1B or in FIG. 2.

This invention may be conveniently implemented using a conventional general-purpose digital computer programmed according to the teachings of the present specification, as will be apparent to those skilled in the computer arts. Appropriate software coding can readily be prepared by skilled programmers based on the teachings of the present disclosure, as will be apparent to those skilled in the software arts. The present invention may also be implemented by the preparation of application-specific integrated circuits or by interconnecting an appropriate network of conventional component circuits, as will be readily apparent to those skilled in the art.

Numerous additional modifications and variations are possible in light of the above teachings. It is therefore to be understood that within the scope of the appended claims, the disclosure of this patent specification may be practiced otherwise than as specifically described herein.

What is claimed as new and desired to be protected by Letters Patent of the United States is:

1. A semiconductor device structure, comprising:
   a semiconductor substrate;
   a resistor layer arranged on the semiconductor substrate, the resistor layer comprising a plurality of resistor segments; and
   a capacitor layer, comprising a capacitor, arranged on the resistor layer, the capacitor layer having a first metal layer providing electrical connection among the plurality of resistor segments, wherein the first metal layer forms one electrode of the capacitor.

2. The semiconductor device structure according to claim 1, wherein:
   the plurality of resistor segments form multiple unit resistors, and
   the capacitor layer further includes
   a dielectric layer arranged on the first metal layer; and
   a second metal layer arranged on the dielectric layer, the second metal layer forming another electrode of the capacitor insulated from the first metal layer by the dielectric layer.

3. A semiconductor device structure, comprising:
   a semiconductor substrate;
   a resistor layer arranged on the semiconductor substrate, the resistor layer comprising a plurality of resistor segments;
   a capacitor layer, comprising a capacitor, overlying the resistor layer, the capacitor layer having a first metal layer, wherein the first metal layer forms one electrode of the capacitor;
   an intermediate metal layer inserted between the resistor layer and the capacitor layer, wherein:
   the plurality of resistor segments form multiple unit resistors,
   the intermediate metal layer provides electrical connection among the plurality of resistor segments, and
   the capacitor layer further includes
   a dielectric layer arranged on the first metal layer; and
   a second metal layer arranged on the dielectric layer, the second metal layer forming another electrode of the capacitor insulated from the first metal layer by the dielectric layer.

4. The semiconductor device structure according to claim 3, further comprising at least one metal wiring layer disposed between the intermediate metal layer and the first metal layer.

5. The semiconductor device structure according to claim 1, wherein the capacitor is a metal-insulator-metal capacitor.

6. A semiconductor device comprising:
   a semiconductor substrate;
   a resistor layer arranged on the semiconductor substrate, the resistor layer comprising a plurality of resistor segments, and
   a capacitor layer, comprising a capacitor, arranged on the resistor layer, the capacitor layer having a first metal layer providing electrical connection among the plurality of resistor segments, wherein the first metal layer forms one electrode of the capacitor, and
   wherein said resistor layer and capacitor layer form part of a circuit for generating a constant output voltage from an input voltage.

7. The semiconductor device according to claim 6, wherein:
   the plurality of resistor segments form multiple unit resistors, and
   the capacitor layer further includes
   a dielectric layer arranged on the first metal layer; and
   a second metal layer arranged on the dielectric layer, the second metal layer forming another electrode of the capacitor insulated from the first metal layer by the dielectric layer.

8. The semiconductor device according to claim 7, wherein said circuit further comprises:
   a voltage divider configured to generate a feedback signal by dividing the output voltage;
   a control circuit configured to output a control signal based on the feedback signal; and
   an output transistor configured to regulate current passing therethrough according to the control signal so that the feedback signal matches a given reference signal,
   wherein the multiple unit resistors are combined via the first metal layer to form the voltage divider connected to the capacitor.

9. The semiconductor device according to claim 7, wherein said circuit further comprises:
   a voltage divider configured to generate a feedback signal by dividing the output voltage;
   a control circuit configured to output a control signal based on the feedback signal;
   an inductor configured to convert the input voltage to the output voltage;
   a switching transistor configured to charge the inductor according to the control signal so that the feedback signal matches a given reference signal; and
   a rectifier configured to discharge the inductor,
   wherein the multiple unit resistors are combined via the first metal layer to form the voltage divider connected to the capacitor.

10. A semiconductor device comprising:
    a semiconductor substrate;
    a resistor layer arranged on the semiconductor substrate, the resistor layer comprising a plurality of resistor segments;
    a capacitor layer, comprising a capacitor, overlying the resistor layer, the capacitor layer having a first metal layer, wherein the first metal layer forms one electrode of the capacitor; and
    an intermediate metal layer between the resistor layer and the capacitor layer, wherein:
    the plurality of resistor segments form multiple unit resistors,
    the intermediate metal layer provides electrical connection among the plurality of resistor segments, and the capacitor layer further includes
a dielectric layer arranged on the first metal layer; and
a second metal layer arranged on the dielectric layer, the second metal layer forming another electrode of the capacitor insulated from the first metal layer by the dielectric layer,
wherein said resistor layer, capacitor layer, and intermediate metal layer form part of a circuit for generating a constant output voltage from an input voltage.

11. The semiconductor device according to claim 10, further comprising at least one metal wiring layer disposed between the intermediate metal layer and the first metal layer.

12. The semiconductor device according to claim 10, wherein said circuit further comprises:
a voltage divider configured to generate a feedback signal by dividing the output voltage;
a control circuit configured to output a control signal based on the feedback signal; and
an output transistor configured to regulate current passing therethrough according to the control signal so that the feedback signal matches a given reference signal,
wherein the multiple unit resistors are combined via the intermediate metal layer to form the voltage divider connected to the capacitor.

13. The semiconductor device according to claim 10, wherein said circuit further comprises:
a voltage divider configured to generate a feedback signal by dividing the output voltage;
a control circuit configured to output a control signal based on the feedback signal;
an inductor configured to convert the input voltage to the output voltage;
a switching transistor configured to charge the inductor according to the control signal so that the feedback signal matches a given reference signal; and
a rectifier configured to discharge the inductor,
wherein the multiple unit resistors are combined via the intermediate metal layer to form the voltage divider connected to the capacitor.

14. The semiconductor device according to claim 6, wherein the capacitor is a metal-insulator-metal capacitor.

15. The semiconductor device structure according to claim 1, wherein the resistor layer and the capacitor are configured to be connected to a substantially same potential.

16. The semiconductor device structure according to claim 1, wherein the resistor layer and the capacitor are connected in parallel.

17. The semiconductor device structure according to claim 1, wherein the resistor layer and the capacitor are connected in series.

18. The semiconductor device structure according to claim 1, wherein the plurality of resistor segments form one or more resistors.

* * * * *